United States Patent
Wu et al.

(10) Patent No.: US 8,358,541 B1
(45) Date of Patent: *Jan. 22, 2013

(54) WRITE PRE-COMPENSATION FOR NONVOLATILE MEMORY

(75) Inventors: Zining Wu, Los Altos, CA (US); Xueshi Yang, Cupertino, CA (US); Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/251,822

(22) Filed: Oct. 3, 2011

Related U.S. Application Data

(63) Continuation of application No. 12/196,819, filed on Aug. 22, 2008, now Pat. No. 8,031,526.

(60) Provisional application No. 60/957,577, filed on Aug. 23, 2007, provisional application No. 60/983,376, filed on Oct. 29, 2007.

(51) Int. Cl.
*G11C 11/34* (2006.01)
(52) U.S. Cl. ......... 365/185.18; 365/185.02; 365/185.24; 365/185.33
(58) Field of Classification Search .......... 365/185.02, 365/185.18, 185.24, 185.33, 206, 210.11
See application file for complete search history.

(56) References Cited

U.S. PATENT DOCUMENTS

| | | | |
|---|---|---|---|
| 5,867,429 A | 2/1999 | Chen et al. | |
| 6,279,133 B1 | 8/2001 | Vafai et al. | |
| 6,501,812 B1 | 12/2002 | Yada | |
| 7,505,318 B2 | 3/2009 | Fukuda et al. | |
| 2007/0067704 A1 | 3/2007 | Altintas et al. | |
| 2007/0171730 A1 | 7/2007 | Ramamoorthy et al. | |
| 2007/0189073 A1* | 8/2007 | Aritome | 365/185.18 |
| 2008/0310224 A1* | 12/2008 | Roohparvar et al. | 365/185.03 |
| 2009/0034337 A1* | 2/2009 | Aritome | 365/185.18 |

FOREIGN PATENT DOCUMENTS

| | | |
|---|---|---|
| GB | 2 418 820 | 4/2006 |
| WO | WO 2007/132453 | 11/2007 |

OTHER PUBLICATIONS

The International Search Report and the Written Opinion of the International Searching Authority, or the Declaration mailed Mar. 3, 2009, for International Application No. PCT/US2008/074414, filed Aug. 27, 2008, 13 pages.

* cited by examiner

*Primary Examiner* — Pho M Luu
*Assistant Examiner* — Thao Bui

(57) ABSTRACT

A system including a programming module and an interference module. The programming module is configured to determine a programming value to which a state of a target cell is to be programmed, wherein the programming value is determined based on states of one or more cells near the target cell. The interference module is configured to generate interference values based on (i) the state of the target cell and (ii) the states of the one or more cells near the target cell. The programming module is further configured to determine the programming value based on at least one of the interference values selected according to (i) the state of the target cell and (ii) the states of the one or more cells near the target cell.

17 Claims, 11 Drawing Sheets

| Target Cell | First Adjacent Cell | Second Adjacent Cell | Interference Estimate | Adj. Prog. Values |
|---|---|---|---|---|
| 1 | 1 | 1 | A | Q1 Instead of Q(1) |
| 1 | 1 | 0 | B | Q2 Instead of Q(1) |
| 1 | 0 | 1 | C | Q3 Instead of Q(1) |
| 1 | 0 | 0 | D | Q4 Instead of Q(1) |
| 0 | 1 | 1 | E | Q5 Instead of Q(0) |
| 0 | 1 | 0 | F | Q6 Instead of Q(0) |
| 0 | 0 | 1 | G | Q7 Instead of Q(0) |
| 0 | 0 | 0 | H | Q8 Instead of Q(0) |

FIG. 3C

WRITE PRE-COMPENSATION FOR NONVOLATILE MEMORY

CROSS-REFERENCE TO RELATED APPLICATIONS

This present disclosure is a continuation of U.S. Pat. No. 8,031,526, issued on Oct. 4, 2011, which claims priority under 35 U.S.C. §119(e) to the following provisional applications: i) U.S. Provisional Application No. 60/957,577, filed on Aug. 23, 2007; and ii) U.S. Provisional Application No. 60/983,376, filed on Oct. 29, 2007.

FIELD

The present disclosure relates to semiconductor memory, and more particularly to pre-compensating data to be written in memory cells based on estimated inter-cell interference.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor memory (memory) that stores binary data is generally of two types: volatile and nonvolatile. Volatile memory loses stored data when power to the memory is turned off. Nonvolatile memory, on the other hand, retains stored data even when power to the memory is turned off.

Memory is typically packaged in memory integrated circuits (ICs). Memory ICs comprise memory arrays. Memory arrays include rows and columns of memory cells (cells). Cells store binary data (bits). Cells of memory such as flash memory, phase-change memory, etc. can store more than one bit per cell.

Referring now to FIG. 1, an exemplary memory IC 10 is shown. The memory IC 10 comprises a memory array 12, a bit line decoder 14, a word line decoder 16, and a control module 18. The memory array 12 comprises (m+1)=M rows and (n+1)=N columns of (M*N) cells 20, where m and n are integers greater than 1. Each of the M rows includes N cells. The bit line decoder 14 selects N columns of cells 20 via bit lines BL0-BLn. The word line decoder 16 selects M rows of cells 20 via word lines WL0-WLm.

The control module 18 comprises a read/write (R/W) control module 22 and an address control module 24. The R/W control module 22 communicates with a host 26 via a bus 28. The bus 28 comprises address, data, and control lines. The host 26 issues R/W instructions to the R/W control module 22 via the bus 28 when reading and writing data from and to the cells 20. The R/W control module 22 reads and writes data from and to the cells 20 based on the R/W instructions. The address control module 24 controls addressing of the cells 20 via the bit line decoder 14 and the word line decoder 16 during R/W operations.

SUMMARY

In general, in one aspect, this specification describes a system including a programming module and an interference module. The programming module is configured to determine a programming value to which a state of a target cell is to be programmed, wherein the programming value is determined based on states of one or more cells near the target cell, and wherein the programming value is affected by the states of the one or more cells near the target cell. The interference module is configured to generate interference values based on (i) the state of the target cell and (ii) the states of the one or more cells near the target cell, wherein the interference values correspond to effects of the states of the one or more cells near the target cell on the state of the target cell. The programming module is further configured to determine the programming value based on at least one of the interference values selected according to (i) the state of the target cell and (ii) the states of the one or more cells near the target cell.

In still other features, a computer program stored on a computer-readable medium generating instructions executed by a processor comprises receiving data for programming a target cell to a state. The computer program further comprises determining a programming value for programming the target cell to the state based on the state and states of C cells that are adjacent to the target cell. The target cell and the C cells each store K bits per cell, where C and K are integers greater than or equal to 1.

In another feature, the computer program further comprises programming the target cell to the state using the programming value.

In another feature, the computer program further comprises generating the programming value by adjusting a predetermined programming value for programming the target cell to the state based on interference from the C cells. In another feature, the computer program further comprises generating the programming value based on interference from the C cells. The interference is due to one of data written in the C cells and data to be written in the C cells.

In other features, the computer program further comprises generating interference estimates for interference from the C cells based on the state of the target cell and the states of the C cells. The computer program further comprises selecting at least one of the interference estimates according to the state of the target cell and the states of the C cells. The computer program further comprises generating the programming value based on the at least one of the interference estimates. The interference is due to one of data written in the C cells and data to be written in the C cells.

In other features, the computer program further comprises generating interference estimates for interference from the C cells based on the state of the target cell and the states of the C cells, and storing the interference estimates. The computer program further comprises selecting at least one of the interference estimates according to the state of the target cell and the states of the C cells. The computer program further comprises generating the programming value based on the at least one of the interference estimates. The interference is due to one of data written in the C cells and data to be written in the C cells.

In other features, the computer program further comprises generating interference estimates for interference from the C cells based on the state of the target cell and the states of the C cells. The computer program further comprises generating programming values based on the interference estimates and storing the programming values. The computer program further comprises selecting the programming value from the programming values based on the state of the target cell and the states of the C cells. The interference is due to one of data written in the C cells and data to be written in the C cells.

In another feature, the computer program further comprises determining the programming value when the C cells are adjacent to the target cell along a bit line. In another feature, the computer program further comprises determining the programming value when the C cells are adjacent to the target cell along a word line. In another feature, the computer program further comprises determining the programming value when the target cell and the C cells each includes a memory cell of nonvolatile memory. In another feature, the computer program further comprises determining the programming value when the target cell and the C cells each includes a memory cell of one of a flash memory and a phase-change memory. In another feature, the computer program further comprises determining an amount of charge for programming the target cell to the state when the target cell and the C cells each includes a memory cell of flash memory.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3C depicts an exemplary lookup table comprising adjusted programming values according to the present disclosure;

DETAILED DESCRIPTION

Figure 1:
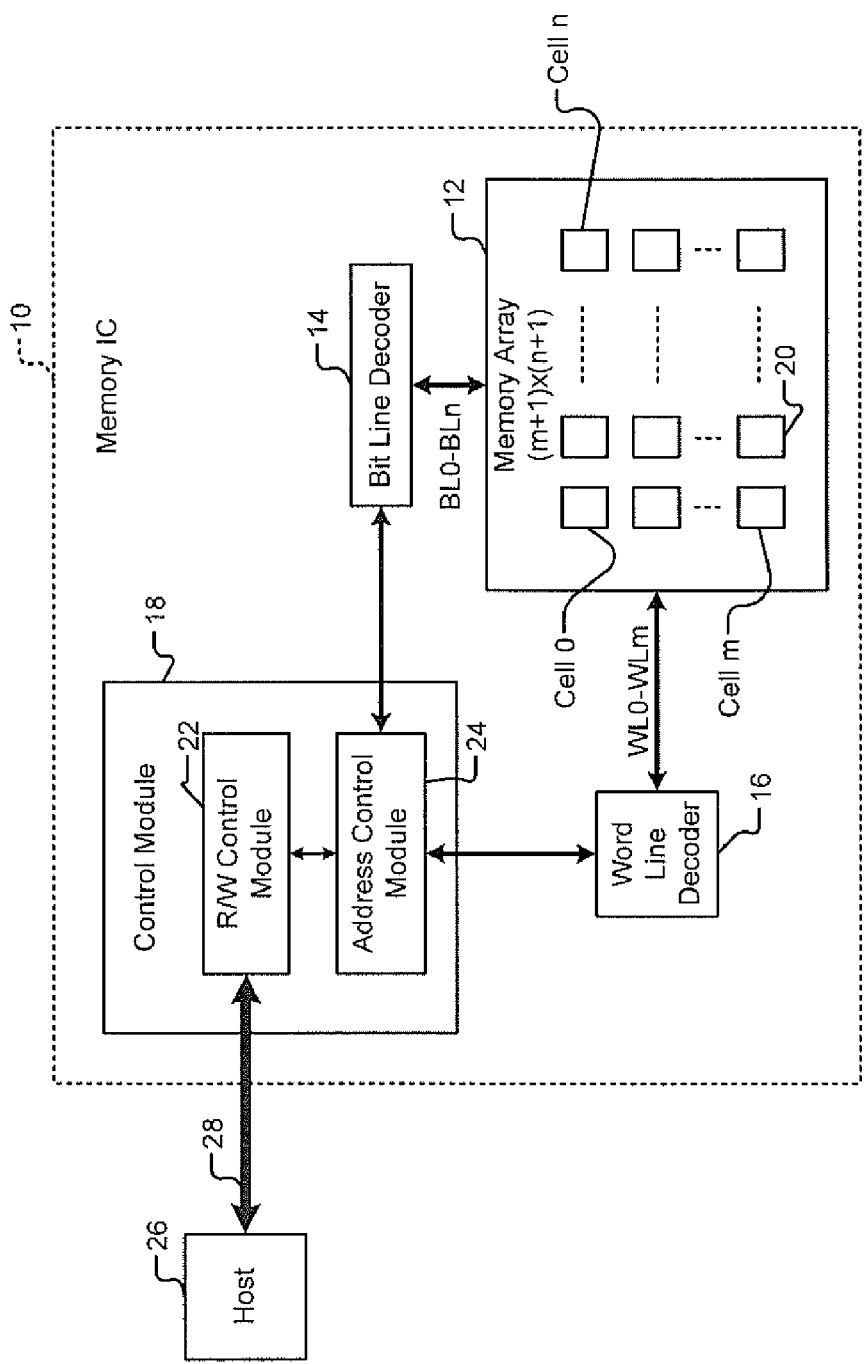
FIG. 1 is a functional block diagram of an exemplary memory integrated circuit (IC) according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 2:
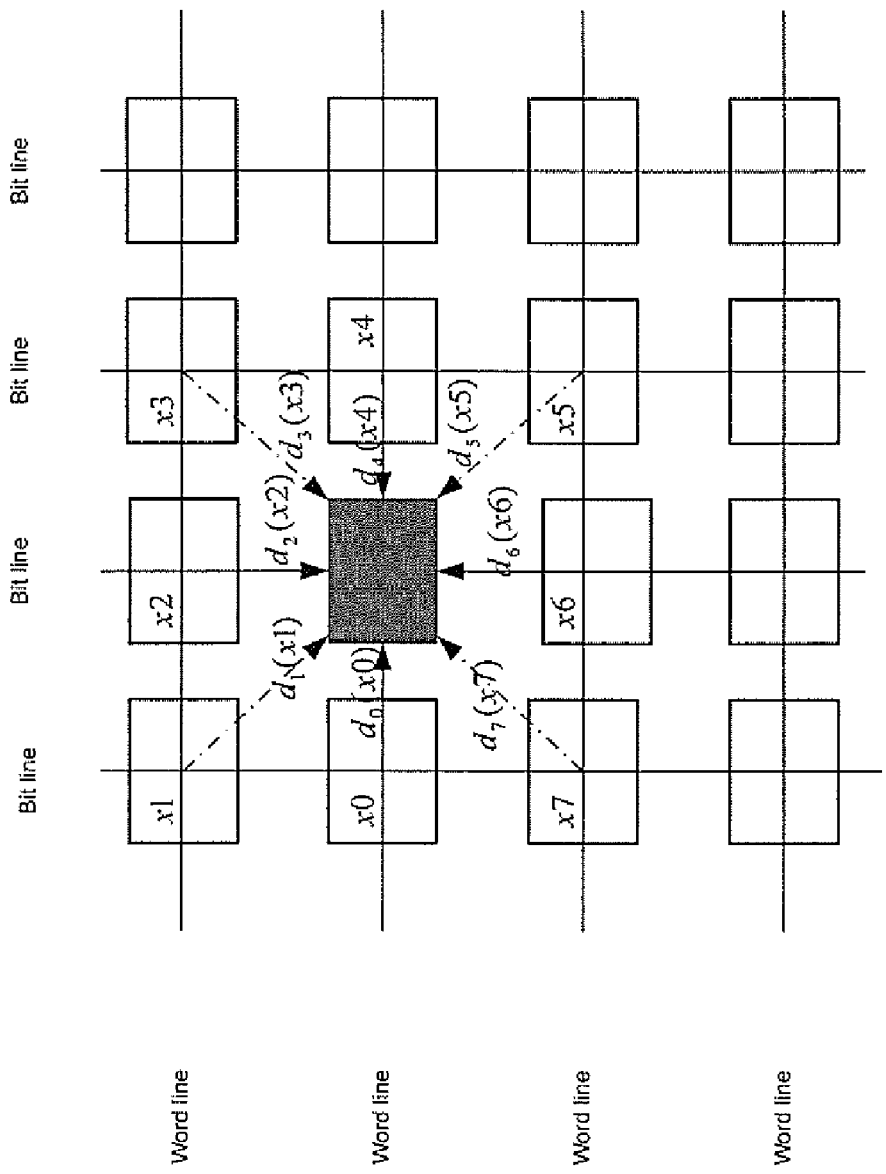
FIG. 2 is a schematic representation of a portion of a memory array of a memory IC.

Referring now to FIG. 2, a portion of a memory array comprising cells of a nonvolatile memory (e.g., flash memory) is shown. A cell from which data is read is called a target cell (shown shaded). When data stored in the target cell is read, data stored in neighboring cells that are adjacent to the target cell may generate interference.

In the memory array, cells may be adjacent to the target cell in two ways: spatially adjacent and/or time-wise adjacent. Cells are spatially adjacent to the target cell when the cells are physically adjacent to the target cell. For example, cells located on either side of the target cell along a bit line (or a word line) are spatially adjacent to the target cell. Cells are time-wise adjacent to the target cell when the cells are written closest to the target cell in the time domain. For example, cells that are written immediately before and/or after writing the target cell are time-wise adjacent to the target cell. Cells can be both spatially and time-wise adjacent, for example, when writing sequence follows spatial location sequence of the cells.

When data stored in the target cell is read, the interference generated by the data stored in at least one adjacent cell is called inter-cell interference. The inter-cell interference may result from various sources depending on the type of memory. For example, in flash memory, which is based on the amount of charge stored in floating gates of transistors, the inter-cell interference may result from capacitive coupling between the floating gates of the transistors.

The inter-cell interference is data-dependent. That is, the inter-cell interference depends on the data stored in the target cell and/or the data stored in the adjacent cells. For example, when the target cell is read, the target cell may receive interference signals $d_i(x_i)$ from the adjacent cells i that store data $x_i$, respectively, where i=0, 1, 2, . . . , and 7. The interference signals $d_i(x_i)$ may depend on the states of the data $x_i$ stored in the adjacent cells i. For example, the interference signals $d_i(x_i)$ may depend on whether $x_i$=0 or $x_i$=1. Being data-dependent, the inter-cell interference may be linear or non-linear.

The interference signals $d_i(x_i)$ may interfere with the target cell when data stored in the target cell is read. Accordingly, the interference signals $d_i(x_i)$ may cause the state of the target cell (i.e., the data stored in the target cell) to be read incorrectly. The inter-cell interference increases as cell density of memory integrated circuits (ICs) increases and/or a number of bits stored per cell increases.

Traditionally, nonvolatile memory systems (e.g., flash memory systems) utilize various techniques to reduce the inter-cell interference. For example, in flash memory systems, metal or dielectric shields are inserted between the floating gates of transistors. Such techniques, however, increase the cost of the memory systems and still cannot eliminate or significantly reduce the inter-cell interference. The inter-cell interference may cause failure of error-correction methods employed by the nonvolatile memory systems for detecting and correcting errors during read/write operations. Error-correction failures, in turn, may degrade performance of the nonvolatile memory systems.

The present disclosure proposes systems and methods for estimating the inter-cell interference before writing data in cells and pre-compensating the data to be written in the cells based on the estimated inter-cell interference. For example, in flash memory systems, threshold voltages used to program target cells can be adaptively adjusted based on data written or to be written in adjacent cells so that inter-cell interference is minimized when data is subsequently read from the target cells.

Throughout this disclosure, flash memory is used as an example only. The teachings of the present disclosure are applicable to any nonvolatile and volatile memory that suffers from inter-cell interference. Additionally, the teachings of the present disclosure may be applied to nonvolatile memory having multiple data storage regions in a single memory cell (e.g., mirror-bit flash), where interference may exist between the data storage regions.

The detailed description is organized as follows. First, mathematical models for an interference signal and a read signal generated when data is read from the target cell are proposed. Using the mathematical models, solutions for eliminating or mitigating the inter-cell interference are presented. Using the solutions, pre-compensation schemes for writing user data in flash memory are discussed. Simplified mathematical analyses based on practical considerations are presented. Using the simplified mathematical analyses, an example of estimating inter-cell interference and pre-compensating for the inter-cell interference is presented. Systems and methods that implement the mathematical solutions and pre-compensation schemes are described.

First, the mathematical models for the interference signal and the read signal generated when data is read from the target cell (also called a readout signal) are presented. Let x denote the data stored in the target cell. Let s(x) denote a noise-free read signal generated when reading the data stored in the target cell. The noise-free read signal s(x) excludes any inter-cell interference and any noise. The noise-free read signal may typically include a current or voltage signal generated when the data from the target cell is read.

The interference signal generated due to the inter-cell interference resulting from the data stored in the adjacent cells can be mathematically expressed by the following function:
$d_i(x_i), i=0, 1, \ldots, 7$
where i is a cell index that denotes a location of the adjacent cell relative to the target cell. The adjacent cell having the cell index i stores data $x_i$ and generates the interference signal $d_i(x_i)$, where $i=0, 1, 2, \ldots,$ and 7.

The interference signals are directional and data-dependent. That is, the interference signals from the adjacent cells depend on the locations of the adjacent cells relative to the target cell. Additionally, the interference signals from the adjacent cells depend on the data stored in the adjacent cells. The adjacent cells may be spatially and/or time-wise adjacent to the target cell. The function $d_i(x_i)$ can be linear or nonlinear.

The readout signal is generated when data stored in the target cell is read. The readout signal typically includes the inter-cell interference signals and noise. The readout signal y(x) can be mathematically expressed as follows:

$$y(x) = s(x) + \sum_{i=0}^{7} d_i(x_i) + n(x)$$

where $$\sum_{i=0}^{7} d_i(x_i)$$

denotes an interference term, which is a summation of the inter-cell interference signals; and n(x) denotes any other noise in addition to the interference term.

Using the mathematical models presented above, solutions for eliminating or mitigating the inter-cell interference are now discussed. The readout signal y(x) may become interference-free (except for the noise n(x)) when the interference term is eliminated. The interference term can be eliminated as follows.

Initially, the data written (or to be written) in i adjacent cells is examined. Hereinafter, references to the phrase "data written" should be understood to include the phrase "data to be written," and vice versa. An estimated interference that may be generated by the data $x_i$ written in the $i^{th}$ adjacent cell is computed based on the interference function $d_i(x_i)$. The estimated interference is generated for all adjacent cells i, where $i=0, 1, 2, \ldots,$ and 7. The estimated interferences for all of i adjacent cells are summed to generate the interference term.

A target threshold voltage used to program the target cell is called a programming target. The programming target is adjusted based on the estimated interference term. When the programming target is adjusted, an estimated readout signal s'(x), which may be generated when the target cell is subsequently read, is given by the following equation:

$$s'(x) = s(x) - \sum_{i=0}^{7} d_i(x_i)$$

When the programming target is adjusted, the actual readout signal y(x) is given by the following equation:

$$y(x) = s'(x) + \sum_{i=0}^{7} d_i(x_i)$$
$$= s(x) - \sum_{i=0}^{7} d_i(x_i) + \sum_{i=0}^{7} d_i(x_i) + n(x)$$
$$= s(x) + n(x)$$

Thus, when the programming target is adjusted based on the estimated interference term, the actual readout signal y(x) is interference-free as desired. The amount by which the programming target is adjusted (i.e., the interference term) is a function of data $x_i$ written in the adjacent cells i.

Before discussing how to adjust the programming target, methods of reading data from the cells are summarized. Typically, data stored in flash memory cells is retrieved by current sensing or threshold voltage sensing. In current sensing, a constant voltage is applied to a control gate of the cell while a bias voltage is applied across a source and a drain of the cell. Current flowing from the source to the drain is measured. Generally, the current is a deterministic function (e.g., a linear function) of the threshold voltage of the cell, which in turn is a deterministic function (e.g., a linear function) of the amount of charge programmed in the floating gate of the cell.

In threshold voltage sensing, a voltage ramp is applied to the control gate while a bias voltage is applied across the source and the drain of the cell. Current flowing from the source to the drain is examined. When the voltage at the control gate exceeds the threshold voltage of the cell, current begins to flow from the drain to the source. The voltage at the control gate is measured when the current reaches a predetermined value. The value of the voltage measured at the control gate is a deterministic function (e.g., a linear function) of the amount of charge programmed in the floating gate.

Mathematically, the noise-free readout signal s(x) may be related to the amount of charge Q programmed into the floating gate by a transfer function. Let t(.) denote the transfer function. Accordingly, $t^{-1}(.)$ may denote an inverse function of t(.).

To obtain the estimated readout signal s'(x) given by the equation $$s'(x) = s(x) - \sum_{i=0}^{7} d_i(x_i),$$

the programming target may be adjusted as expressed by the equation $$Q_{target} = t^{-1}\left(s(x) - \sum_{i=1}^{7} d_i(x_i)\right)$$

instead of generating the programming target according to the traditional equation $$Q_{target} = t^{-1}(s(x)).$$

The mathematical analyses presented above are now simplified based on practical considerations. Practically, in most memory systems, the inter-cell interference may occur only in one dimension: along bit lines or along word lines. Accordingly, interference from all the adjacent cells need not be considered, and the mathematical analyses may be simplified by considering only one-dimensional inter-cell interference. The teachings of the present disclosure, however, are not limited only to one-dimensional inter-cell interference.

For example, in floating-gate NAND flash memory, the inter-cell interference due to parasitic capacitance coupling between floating gates occurs mainly in cells along bit lines. Cells located along a bit line may receive interference signals from adjacent cells located along the same bit line. Since metal shields are placed between adjacent bit lines, interference signals received by cells located along a bit line from cells located along neighboring bit lines may be attenuated.

Thus, the inter-cell interference may exist mainly along bit lines. Accordingly, the interference term may include interference resulting from only two adjacent cells located on the same bit line as the target cell. Instead, when the metal shields are placed between adjacent word lines, the inter-cell interference may exist along word lines. Accordingly, the interference term may include interference resulting from only two adjacent cells located on the same word line as the target cell.

Additionally, since interference signals from cells beyond immediately adjacent cells along a bit line (or a word line) may diminish exponentially, the interference signals from non-immediate neighboring cells along the bit line may be disregarded to simplify this discussion. If desired, however, the interference signals from non-immediate neighboring cells may be considered by extending the mathematical analyses to include the interference signals from non-immediate neighboring cells.

Accordingly, the interference function $d_i(x_i)$ can be approximated by a linear function given by the following equation:

$$d_i(x_i) = a \cdot x_i + b \text{ for all } i$$

where a and b are empirical constants, respectively.

Additionally, the transfer function t(.) can be expressed as a linear function given by the following equation:

$$s = t(Q) = c \cdot Q + d$$

where c and d are empirical constants, respectively.

Since a, b, c, and d can be empirically determined, the estimated adjustments to the programming target can be empirically determined and stored in a lookup table. Accordingly, the programming target can be easily adjusted using the estimated adjustments stored in the lookup table. Alternatively, the programming target can be adjusted by simple computations that can be performed on-the-fly (i.e., in real time while writing data in the target cell).

Adjusting the programming target based on the estimated interference is called write pre-compensation. The pre-compensation approximately nullifies the interference resulting from the adjacent cells. The pre-compensation may be performed by examining the data written (or to be written) to the adjacent cells, estimating the interference via a function d(.), and by adjusting the programming target so that the effect of d(.) is approximately nullified.

An example of pre-compensation by considering inter-cell interference from only two adjacent cells follows. Let x denote the data to be written to the targeted cell. Without considering the interference, the programming target in terms of the amount of charge is Q(x). Considering only two adjacent cells, let (x−1) and (x+1) denote the data written in the two adjacent cells. Let d(x−1, x+1) denote the estimated interference resulting from the two adjacent cells when data is read from the target cell.

Due to interference resulting from the two adjacent cells, the actual readout signal when the target cell is read may be s(Q(x))+d(x−1, x+1). Accordingly, the programming target or the amount of charge corresponding to the programming target may be adjusted by ΔQ so that the readout signal is approximately s(Q(x)), i.e., interference-free.

The adjustment amount ΔQ is a function of d(x−1, x+1) or more directly a function of the data (x−1) and (x+1) written in the two adjacent cells. The adjusted programming target, Q'=Q(x)+ΔQ(x−1, x+1), is a function of x, (x−1), and (x+1). Practically, the function Q' can be determined empirically or estimated and can be implemented as a look-up table.

In sum, the programming target for the target cell may be dynamically adjusted by an amount determined by the data written to at least one adjacent cell. The adjustment eliminates or mitigates the interference resulting from at least one adjacent cell. The adjacent cell(s) can be written at different times than the targeted cell. In other words, the adjacent cells can include cells already written or cells to be written. The adjacent cell(s) may or may not be located physically next to the targeted cell. That is, the adjacent cells may be spatially and/or time-wise adjacent.

Referring generally to FIGS. 3A-4B, a system and a method for estimating the inter-cell interference and adjusting the programming target based on the estimated inter-cell interference are shown. The system is described briefly in conjunction with FIG. 3A and in detail in conjunction with FIGS. 3B and 3C. The method is described in conjunction with FIGS. 4A and 4B.

Figure 3A:
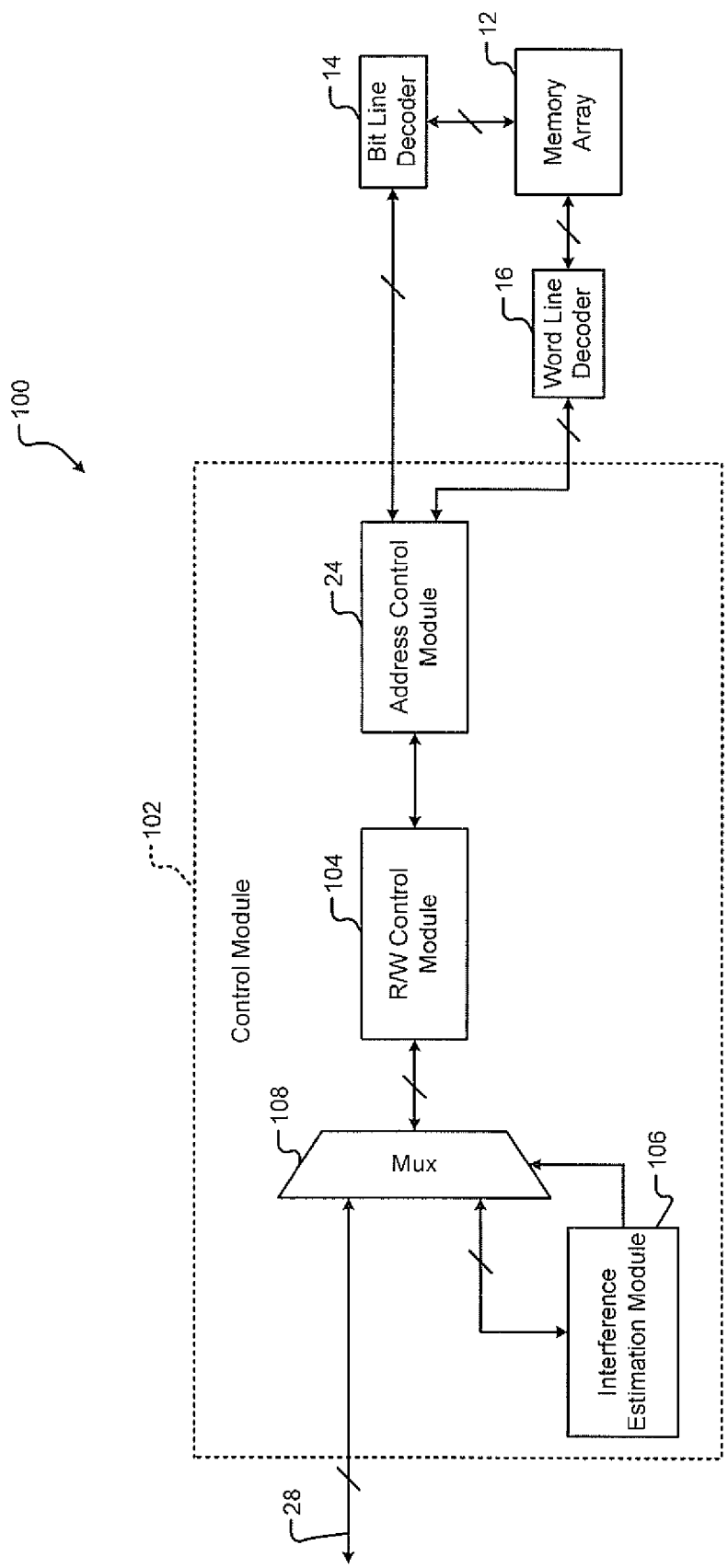
FIG. 3A is a functional block diagram of a system for estimating inter-cell interference and generating adjusted programming values according to the present disclosure.

Referring now to FIG. 3A, a system 100 comprises a control module 102, the memory array 12, the bit line decoder 14, and the word line decoder 16. The control module 102 comprises a read/write (R/W) control module 104, the address control module 24, an interference estimation module 106, and a multiplexer (mux) 108. The R/W control module 104 communicates with the host 26 (not shown) via the bus 28. The R/W control module 104 controls R/W operations of the cells 20 of the memory array 12. The address control module 24 controls addressing of the cells 20 during the R/W operations.

The interference estimation module 106 generates inter-cell interference estimates (hereinafter interference estimates) for interference that may be received from one or more adjacent cells when reading target cells. The adjacent cells are spatially and/or time-wise adjacent to the target cells. The interference estimation module 106 may generate the interference estimates empirically before user data is written in the cells 20. The interference estimation module 106 may store the interference estimates in a lookup table (LUT).

In some implementations, the interference estimates may be computed using mathematical models and provided in the LUT at the time of manufacture for all data combinations that can be stored in the target cells and the adjacent cells. The LUT may be stored in the interference estimation module 106 at the time of manufacture. Subsequently, when user data received from the host 26 is written in the target cells, the R/W control module 104 may adjust programming targets of the target cells on-the-fly (i.e., in real time while writing) based on the interference estimates stored in the LUT.

Alternatively, the interference estimation module 106 may generate adjusted programming targets (i.e., adjusted programming values to program user data in target cells) based on the interference estimates that are generated empirically or provided at the time of manufacture. Specifically, the interference estimation module 106 may generate adjusted programming values for all data combinations that can be stored in the target cells and the adjacent cells. The interference estimation module 106 may store the adjusted programming values in the LUT. Subsequently, when writing user data in the target cells, the R/W control module 104 may lookup the adjusted programming values corresponding to the user data to be written in the target cells and the adjacent cells.

The R/W control module 104 writes the user data in the target cells according to the adjusted programming values. During subsequent read operations, the R/W control module 104 correctly reads the data stored in the target cells despite the interference that may result from the adjacent cells.

The mux 108 allows the interference estimation module 106 or the host 26 to communicate with the R/W control module 104. Specifically, the mux 108 allows the interference estimation module 106 to communicate with the R/W control module 104 when the interference estimation module 106 generates the inter-cell interference estimates. The mux 108 allows the host 26 to communicate with the R/W control module 104 during normal R/W operations. The interference estimation module 106 controls the mux 108 by generating a control signal and by changing states of the control signal.

Figure 3B:
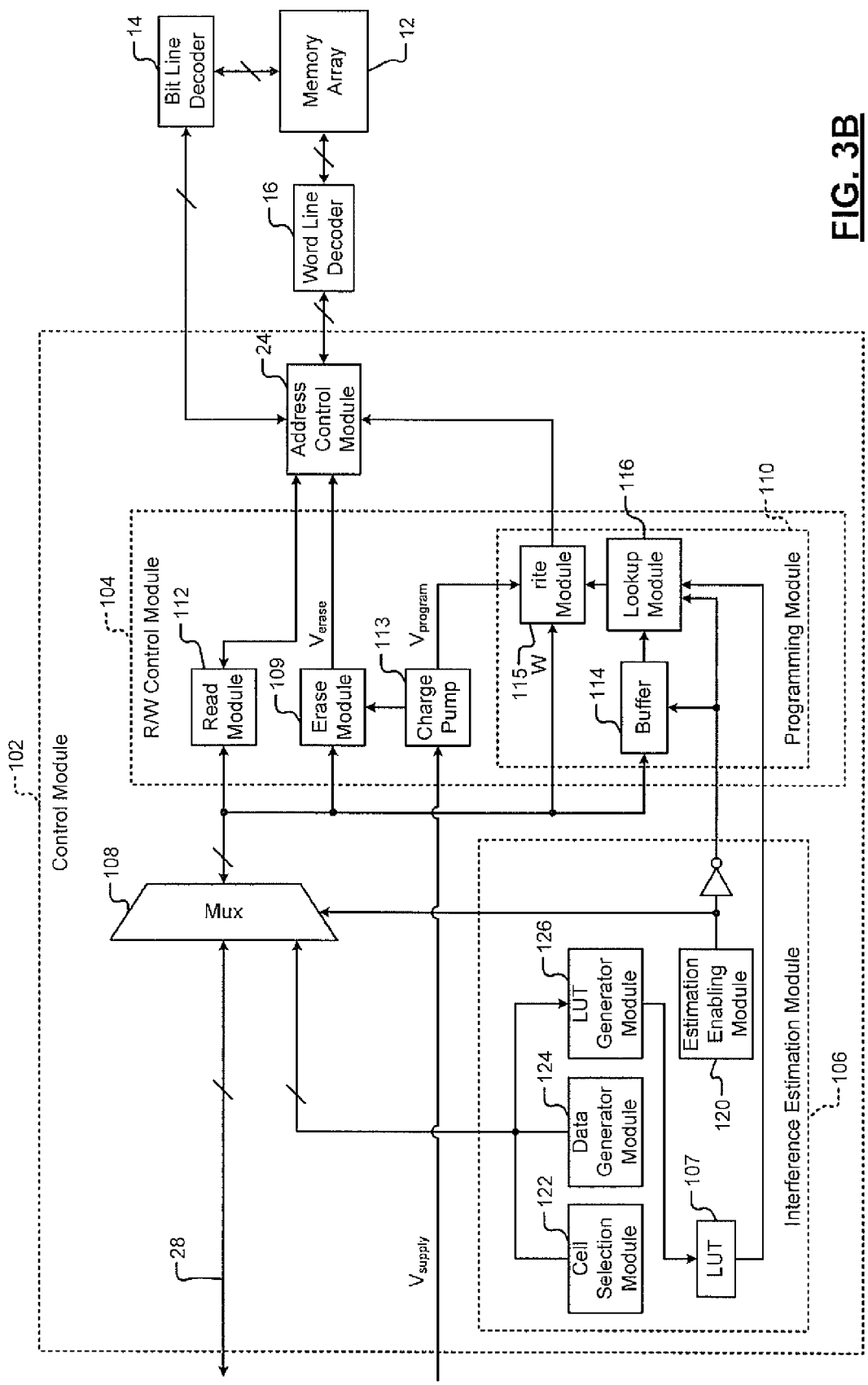
FIG. 3B is a functional block diagram of a system for estimating inter-cell interference and generating adjusted programming values according to the present disclosure.

Referring now to FIG. 3B, the R/W control module 104 comprises an erase module 109, a programming module 110, a read module 112, and a charge pump 113. The erase module 109 may selectively erase the cells 20. For example, the erase module 109 may erase the cells 20 before user data is written in the cells 20 during normal operation. Additionally, the erase module 109 may erase cells selected by the interference estimation module 106 during interference estimation.

The programming module 110 programs (i.e., writes data in) the cells 20. The read module 112 reads data stored in the cells 20. The charge pump 113 generates an erase voltage $V_{erase}$ and a program voltage $V_{program}$ based on a supply voltage $V_{supply}$. The charge pump 113 supplies the erase and program voltages $V_{erase}$, $V_{program}$ to the erase and programming modules 109, 110 during erase and programming operations, respectively.

The programming module 110 comprises a write module 115, a buffer 114, and a lookup module 116. The write module 115 receives addresses of the cells 20 and data to be written in the cells 20 via the mux 108. The write module 115 receives the addresses and data from the host 26 during normal operation and from the interference estimation module 106 during interference estimation. The write module 115 writes the data in the cells 20.

The buffer 114 and the lookup module 116 are enabled during normal operation and disabled during interference estimation using an inverted value of the control signal generated by the estimation enabling module 120. During normal operation, the buffer 114 buffers user data that is recently written and that is to be written in the cells 20. By looking up the contents of the buffer 114, the lookup module 116 determines the address of next the target cell to be written and the user data to be written in the target cell. Additionally, the lookup module 116 determines the addresses of the adjacent cells and the user data that is written in the adjacent cells.

Based on the address and the user data information of the target cell and the adjacent cells, the lookup module 116 looks up the corresponding adjusted programming value from the LUT. The lookup module 116 outputs the adjusted programming value to the write module 115. The write module 115 writes the user data in the next target cell using the adjusted programming value.

The interference estimation module 106 comprises an estimation enabling module 120, a cell selection module 122, a data generator module 124, a LUT generator module 126, and a LUT 107. When interference estimation begins, the estimation enabling module 120 generates the control signal having a first state that allows the interference estimation module 106 instead of the host 26 to communicate with the R/W control module 104. When normal operation begins, the estimation enabling module 120 generates the control signal having a second state that allows the host 26 instead of the interference estimation module 106 to communicate with the R/W control module 104. In some implementations, the host 26 and/or the interference estimation module 106 may control their respective communication with the R/W control module 104 during the normal operation and interference estimation, respectively.

During interference estimation, the cell selection module 122 generates addresses that select the target cells and adjacent cells of the memory array 12. The data generator module 124 generates different data combinations to write in the selected target and adjacent cells. For example, the data generator module 124 may generate a 1 to write in the target cell, followed by 1's to write in the adjacent cells, followed by 0's to write in the target cells. Subsequently, the data generator module 124 may generate a 0 to write in the target cell and repeat the process.

The write module 115 writes the data combinations in the target cells and the adjacent cells using standard (i.e., unadjusted) programming values. The read module 112 reads the data stored in the target cells and provides values of readout signals to the LUT generator module 126. Based on the programming values used to write the data in the target cells and the values of readout signals, the LUT generator module 126 generates interference estimates. The LUT generator module 126 generates adjusted programming values based on the interference estimates and stores the adjusted programming values for writing the data in the target cells in the LUT 107. The LUT generator module 126 generates the LUT for all possible data combinations that may be written in the target cells and adjacent cells.

Specifically, when interference estimation begins, the cell selection module 122 selects one of the cells 20 as the target cell. The data generator module 124 generates the data (e.g., a 1) to write in the target cell. The cell selection module 122 and the data generator module 124 communicate the address and the data of the target cell to the write module 115 via the mux 108, respectively.

The write module 115 writes a 1 in the target cell using a first programming value (e.g., a first amount of charge). The read module 112 reads the target cell. The readout signal includes no interference from data stored in any of the other cells since no user data is yet stored in any of the adjacent cells. The LUT generator module 126 stores a first value of the readout signal.

Next, the cell selection module 122 selects a first adjacent cell. The data generator module 124 generates, for example, a 1 to write in the first adjacent cell. The cell selection module 122 and the data generator module 124 communicate the address and the data of the first adjacent cell to the write module 115 via the mux 108, respectively.

The write module 115 writes a 1 in the first adjacent cell using the first programming value. The read module 112 reads the target cell. The readout signal includes interference from the first adjacent cell. The interference depends on the position of the first adjacent cell relative to the target cell. Additionally, the interference depends on the data stored in the target cell (e.g., a 1) and the data stored in the first adjacent cell (e.g., a 1). The LUT generator module 126 stores a second value of the readout signal.

The LUT generator module 126 generates a first interference estimate based on the first and second values of the readout signal and stores the first interference estimate in the LUT 107. The LUT generator module 126 determines a first adjusted programming value (e.g., a first adjusted amount of charge) based on the first interference estimate. The LUT generator module 126 stores the first adjusted programming value in the LUT 107. During normal operation, the write module 115 uses the first adjusted programming value instead of using the first programming value to write a 1 in the target cell when a 1 is written in the first adjacent cell.

Next, the cell selection module 122 selects a second adjacent cell. The data generator module 124 generates, for example, a 1 to write in the second adjacent cell. The cell selection module 122 and the data generator module 124 communicate the address and the data of the second adjacent cell to the write module 115 via the mux 108, respectively.

The write module 115 writes a 1 in the second adjacent cell using the first programming value. The read module 112 reads the target cell. The readout signal includes interference from the first and the second adjacent cells. The interference depends on the positions of the first and second adjacent cells relative to the target cell. Additionally, the interference depends on the data stored in the target cell (e.g., a 1) and the data stored in the first and second adjacent cells (e.g., a 1). The LUT generator module 126 stores a third value of the readout signal.

The LUT generator module 126 generates a second interference estimate based on the first and third values of the readout signal and stores the second interference estimate in the LUT 107. The LUT generator module 126 determines a second adjusted programming value (e.g., a second adjusted amount of charge) based on the second interference estimate. The LUT generator module 126 stores the second adjusted programming value in the LUT 107. During normal operation, the programming module 110 uses the second adjusted programming value instead of using the first programming value to write a 1 in the target cell when a 1 is written in each of the first and second adjacent cells.

Thus, the data generator module 124 generates and the write module 115 writes all possible data combinations (e.g., 1's and 0's) in all of the adjacent cells. The read module 112 reads the data stored in the target cell when each of the data combinations is written in the adjacent cells. The LUT generator module 126 generates interference estimates for each of the data combinations and stores the interference estimates in the LUT 107. Based on the interference estimates, the LUT generator module 126 generates adjusted programming values to program the target cell for each of the data combinations. The LUT generator module 126 stores the adjusted programming values in the LUT 107.

Subsequently, the data generator module 124 may generate and the write module 115 may write, for example, a 0 instead of a 1 in the target cell and repeat the above procedure. Additionally, the cell selection module 122 may select another target cell and associated adjacent cells and repeat the above procedure. For example, the interference estimation module 106 may generate a plurality of lookup tables by selecting target cells in a plurality of memory blocks of the memory array 12, respectively.

Alternatively, the lookup tables comprising the interference estimates for the memory blocks may be computed at the time of manufacture using mathematical models and stored in the interference estimation module 106. The interference estimation module 106 may generate adjusted programming values corresponding to the interference estimates and store the adjusted programming values in the lookup tables. The programming module 110 may lookup the adjusted programming values from the lookup tables when writing user data. Alternatively, the programming module 110 may compute the adjusted programming values on-the-fly based on the interference estimates stored in the lookup tables when writing user data.

Referring now to FIG. 3C, an exemplary LUT 107 is shown. The LUT 107 typically has $(S)^{N+1}$ entries, where S is the number of states per cell, where $S=2^K$ when K is the number of bits per cell, and N is the number of adjacent cells. In FIG. 3C, for example only, the cells 20 may each store a single bit (i.e., a 1 or a 0), and interference from only two adjacent cells is considered.

For example only, the interference estimation module 106 generates interference estimates A, B, C, and D when a 1 is stored in the target cell and when the data written in the first and second adjacent cells is 11, 10, 01, and 00, respectively. The interference estimation module 106 generates adjusted programming values Q1, Q2, Q3, and Q4 based on the interference estimates A, B, C, and D, respectively.

The adjusted programming value Q1 denotes, for example, an actual amount of charge that the programming module 110 may inject into the floating gate of the target cell to write a 1 when a 1 is written in the first and second adjacent cells. Without considering the interference from the first and second adjacent cells, the programming module 110 would inject an amount of charge equal to Q(1) to write a 1 in the target cell. In other words, Q1 represents a charge to write a 1 in the target cell that is pre-compensated for the interference that may result from the adjacent cells each storing a 1.

When the amount of charge used is Q(1) instead of Q1, the read module 112 may read the state of the target cell incorrectly due to interference received from the first and second adjacent cells each storing a 1. When the amount of charge used is Q1 instead of Q(1), however, the read module 112 correctly reads the 1 stored in the target cell despite interference that may be received from the first and second adjacent cells each storing a 1.

The adjusted programming value Q2 denotes, for example, an actual amount of charge that the programming module 110 may inject into a floating gate of the target cell to write a 1 when a 1 and a 0 are written in the first and second adjacent cells, respectively. Without considering the interference from the first and second adjacent cells, the programming module 110 may an amount of charge equal to Q(1) to write a 1 in the target cell. In other words, Q2 represents a charge to write a 1 in the target cell that is pre-compensated for the interference that may result from the adjacent cells storing a 1 and a 0, respectively.

When the amount of charge used is Q(1) instead of Q2, the read module 112 may read the state of the target cell incorrectly due to interference received from the first and second adjacent cells storing a 1 and a 0, respectively. When the amount of charge used is Q2 instead of Q(1), however, the read module 112 correctly reads the 1 stored in the target cell despite interference that may be received from the first and second adjacent cells each storing a 1 and a 0, respectively, and so on.

During normal operation, the interference estimation module 106 changes the state of the control signal to the second state. The mux 108 connects the bus 28 instead of the interference estimation module 106 to the R/W control module 104. The user data that is recently written in the cells 20 and that is to be written in the cells 20 is buffered in the buffer 114. Based on the user data buffered in the buffer 114, the lookup module 116 looks up the adjusted programming values from the LUT 107. The write module 115 writes the user data in the cells 20 based on the adjusted programming values. An example of writing user data in the cells 20 using the adjusted programming values follows.

For example, the user data may include a 1 to be written in a first target cell during a current write operation. From the user data stored in the buffer 114, the write module 115 can determine the address of the target cell where a 1 is to be written. Thereafter, from the user data stored in the buffer 114, the write module 115 can determine the addresses of the adjacent cells and the data that is written in the adjacent cells. For example, a 1 and a 0 may be already stored or is to be written during the current write operation in first and second adjacent cells, respectively.

Based on the addresses of the adjacent cells and the data that is written in the adjacent cells, the lookup module 116 looks up the corresponding adjusted programming value to program a 1 in the target cell. For example, when a 1 and a 0 is already stored or may be written during the current write operation in the first and second adjacent cells, respectively, the lookup module 116 may retrieve the adjusted programming value Q2 from the LUT 107. The write module 115 may write a 1 in the target cell using the adjusted programming value Q2. That is, the write module 115 may program the target cell using an adjusted amount of charge Q2.

A 1 and a 0 may be already written or may be written in the first and second adjacent cells during the current write operation, respectively. Subsequently, during a read operation, when the read module 112 reads the target cell, the read module 112 correctly reads the state of the target cell (i.e., a 1) despite interference that may result from the first and second adjacent cells that store a 1 and a 0, respectively.

Figure 4A:
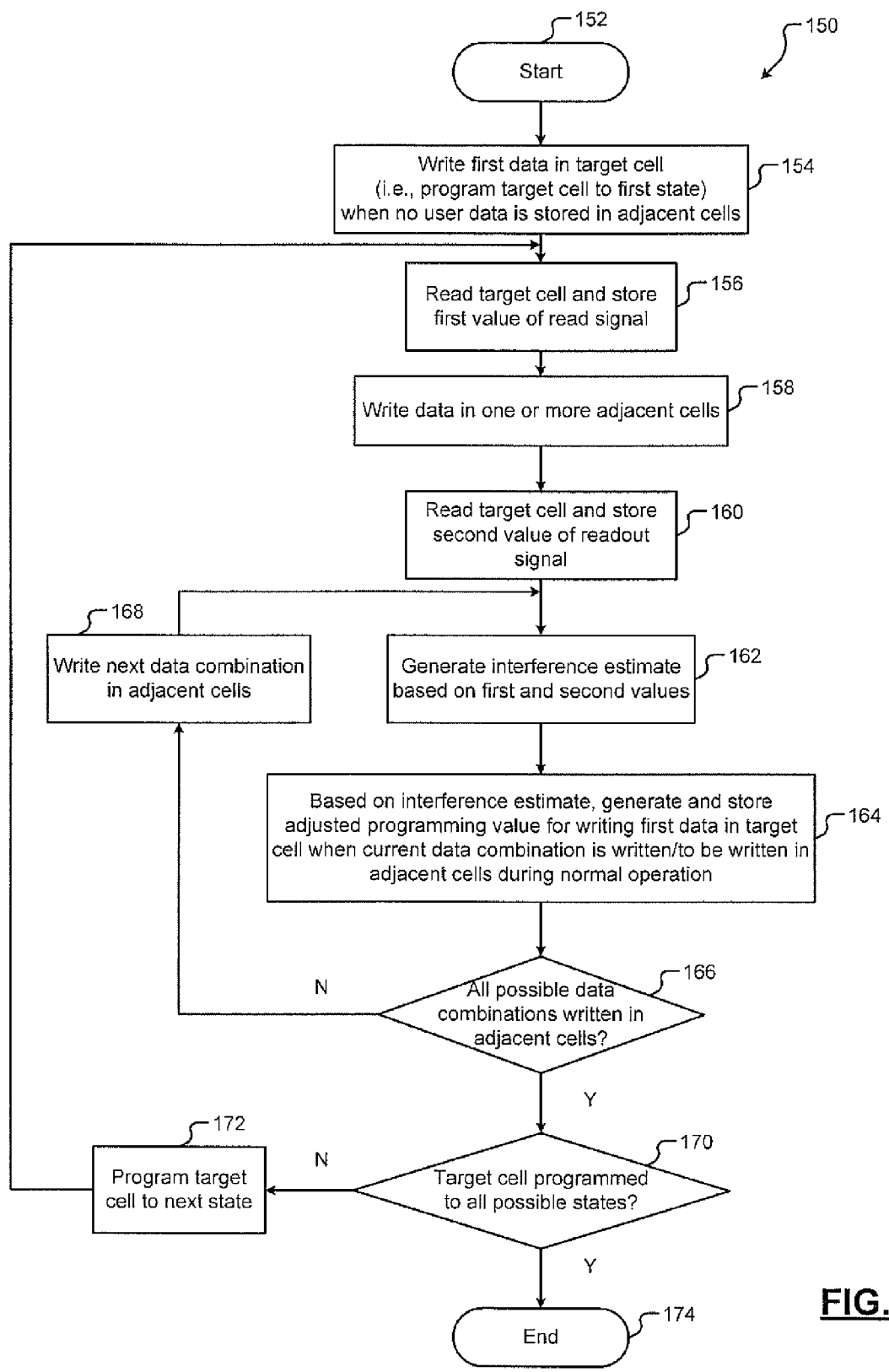
FIG. 4A is a flowchart of a method for estimating inter-cell interference and generating a lookup table comprising adjusted programming values according to the present disclosure.

Referring now to FIG. 4A, a method 150 for generating interference estimates and adjusted programming values is shown. Control begins in step 152. In step 154, control writes first data in the target cell (i.e., programs the target cell to a first state) when no user data is stored in any of the adjacent cells. Control reads the target cell and stores a first value of the readout signal in step 156. Control writes data in a first adjacent cell (or in a plurality of adjacent cells) in step 158. Control reads the target cell and stores a second value of the readout signal in step 160. Control generates an interference estimate based on the first and second values in step 162.

In step 164, based on the interference estimate, control generates and stores an adjusted programming value for writing the first data in the target cell when the current data combination is written in the adjacent cells during normal operation. Control determines in step 166 whether all possible data combinations are written in the adjacent cells. If the result of step 166 is false, control writes a next data combination in the adjacent cells in step 168, and control returns to step 162.

If the result of step 166 is true, control determines in step 170 whether the target cell is programmed to all possible states. If the result of step 170 is false, control programs the target cell to a next possible state in step 172, and control returns to step 156. If the result of step 170 is true, control ends in step 174.

Figure 4B:
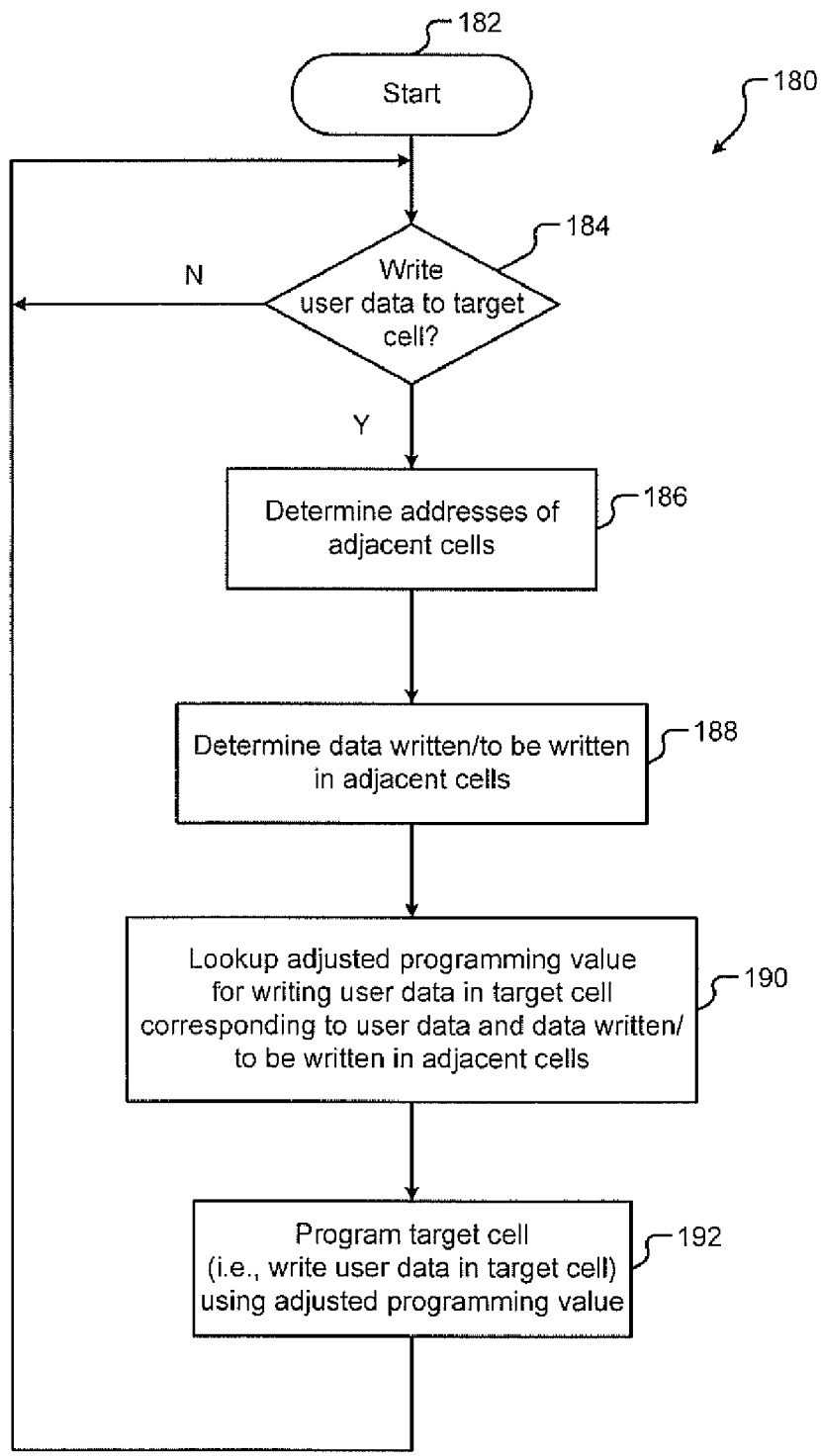
FIG. 4B is a flowchart of a method for writing user data using the adjusted programming values according to the present disclosure.

Referring now to FIG. 4B, a method 180 for programming target cells using adjusted programming values based on data written in adjacent cells is shown. Control begins in step 182. Control determines in step 184 whether user data is to be written in the target cell. Control waits if the result of step 184 is false. If the result of step 184 is true, control determines addresses of adjacent cells in step 186. Control determines data written in the adjacent cells in step 188.

In step 190, control looks up the adjusted programming value for writing the user data in the target cell corresponding to the data written in the adjacent cells. Control programs the target cell (i.e., writes the user data in the target cell) using the looked up adjusted programming value in step 192. Control returns to step 184.

Figure 5A:
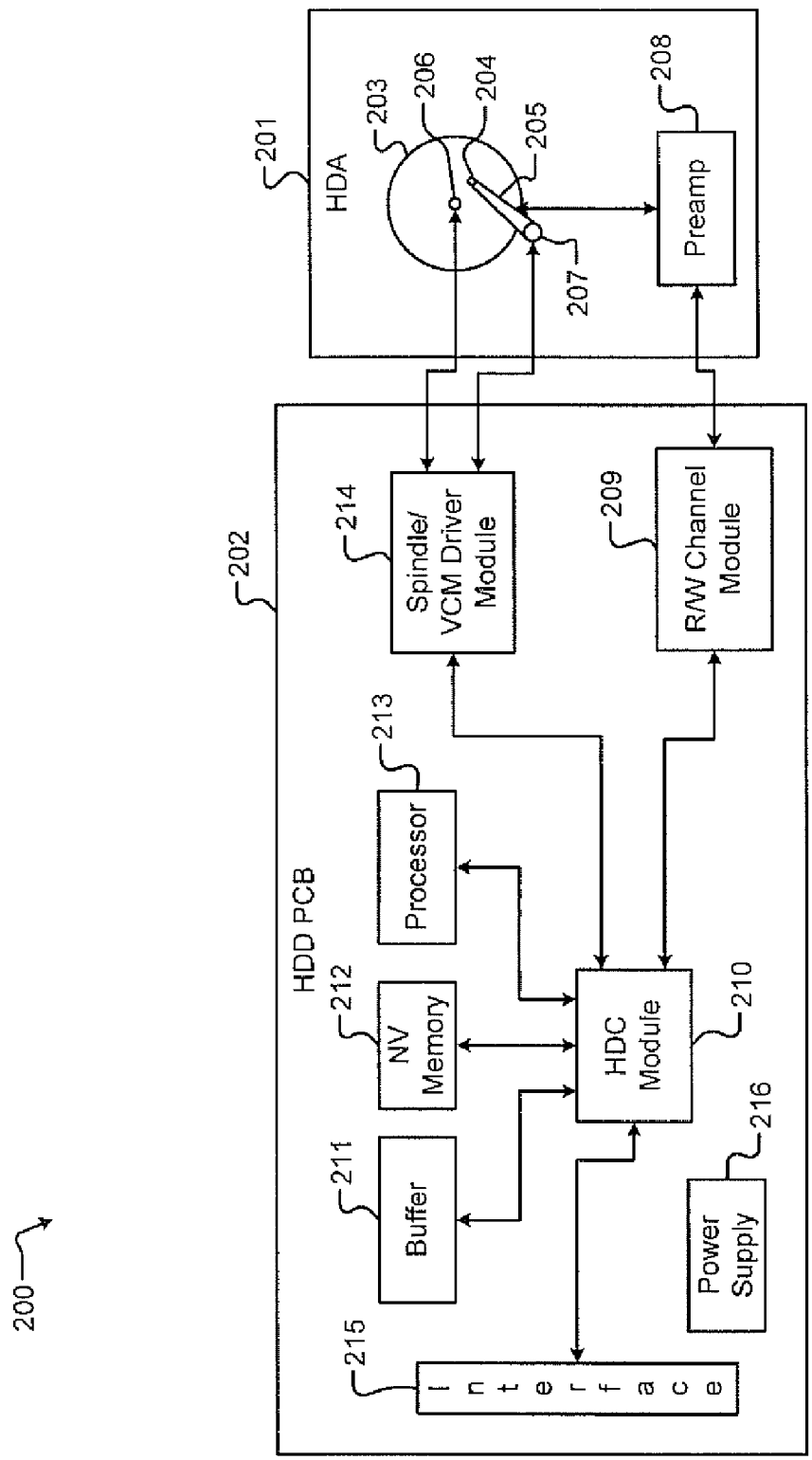
FIG. 5A is a functional block diagram of a hard disk drive.

Referring now to FIGS. 5A-5E, various exemplary implementations incorporating the teachings of the present disclosure are shown. In FIG. 5A, the teachings of the disclosure can be implemented in nonvolatile memory 212 and associated control circuitry of a hard disk drive (HDD) 200. The HDD 200 includes a hard disk assembly (HDA) 201 and an HDD printed circuit board (PCB) 202. The HDA 201 may include a magnetic medium 203, such as one or more platters that store data, and a read/write device 204. The read/write device 204 may be arranged on an actuator arm 205 and may read and write data on the magnetic medium 203. Additionally, the HDA 201 includes a spindle motor 206 that rotates the magnetic medium 203 and a voice-coil motor (VCM) 207 that actuates the actuator arm 205. A preamplifier device 208 amplifies signals generated by the read/write device 204 during read operations and provides signals to the read/write device 204 during write operations.

The HDD PCB 202 includes a read/write channel module (hereinafter, "read channel") 209, a hard disk controller (HDC) module 210, a buffer 211, nonvolatile memory 212, a processor 213, and a spindle/VCM driver module 214. The read channel 209 processes data received from and transmitted to the preamplifier device 208. The HDC module 210 controls components of the HDA 201 and communicates with an external device (not shown) via an I/O interface 215. The external device may include a computer, a multimedia device, a mobile computing device, etc. The I/O interface 215 may include wireline and/or wireless communication links.

The HDC module 210 may receive data from the HDA 201, the read channel 209, the buffer 211, nonvolatile memory 212, the processor 213, the spindle/VCM driver module 214, and/or the I/O interface 215. The processor 213 may process the data, including encoding, decoding, filtering, and/or formatting. The processed data may be output to the HDA 201, the read channel 209, the buffer 211, nonvolatile memory 212, the processor 213, the spindle/VCM driver module 214, and/or the I/O interface 215.

The HDC module 210 may use the buffer 211 and/or nonvolatile memory 212 to store data related to the control and operation of the HDD 200. The buffer 211 may include DRAM, SDRAM, etc. Nonvolatile memory 212 may include any suitable type of semiconductor or solid-state memory, such as flash memory (including NAND and NOR flash memory), phase-change memory, magnetic RAM, and multi-state memory, in which each memory cell has more than two states. The spindle/VCM driver module 214 controls the spindle motor 206 and the VCM 207. The HDD PCB 202 includes a power supply 216 that provides power to the components of the HDD 200.

Figure 5B:
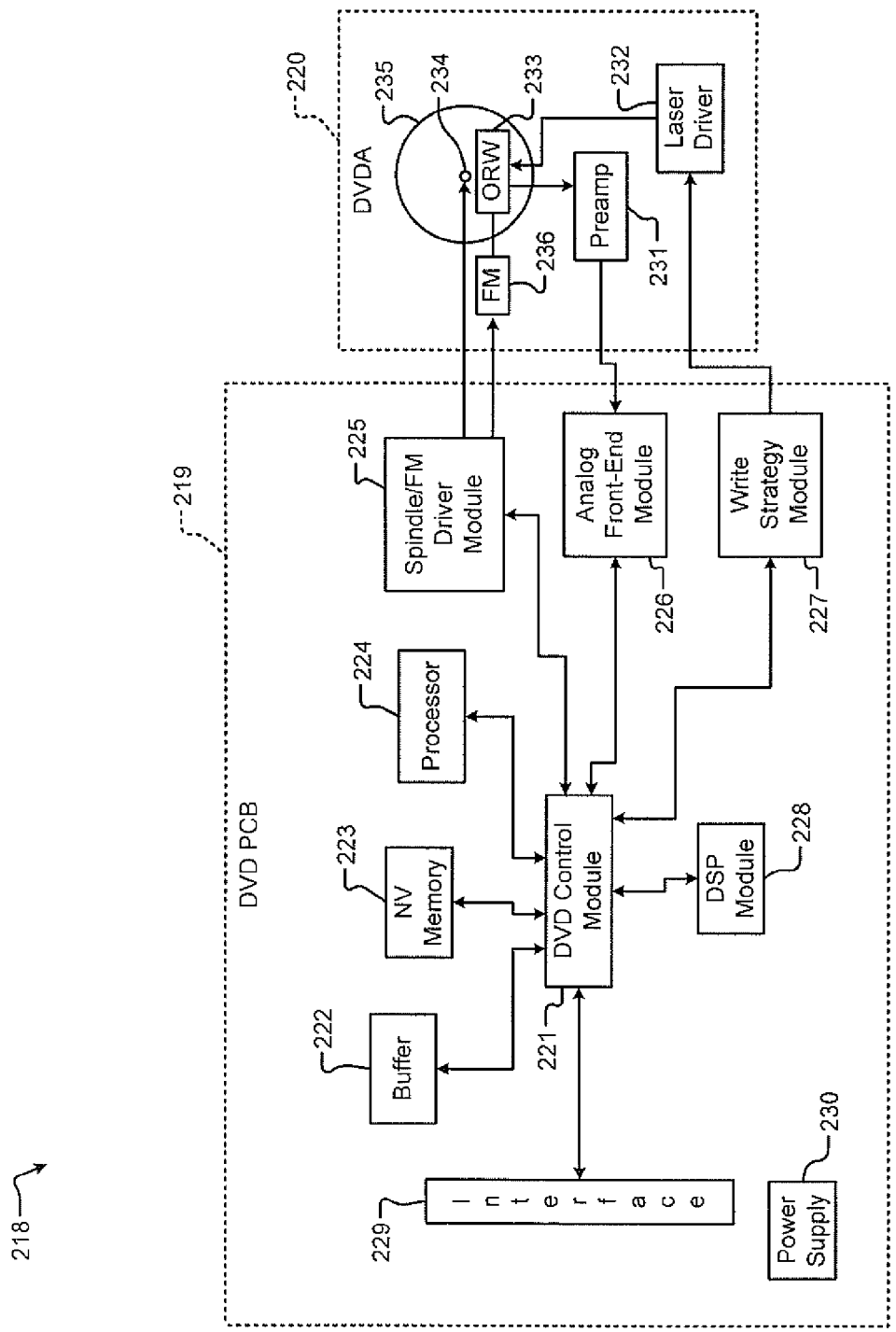
FIG. 5B is a functional block diagram of a DVD drive.

In FIG. 5B, the teachings of the disclosure can be implemented in nonvolatile memory 223 and associated control circuitry of a DVD drive 218 or of a CD drive (not shown). The DVD drive 218 includes a DVD PCB 219 and a DVD assembly (DVDA) 220. The DVD PCB 219 includes a DVD control module 221, a buffer 222, nonvolatile memory 223, a processor 224, a spindle/FM (feed motor) driver module 225, an analog front-end module 226, a write strategy module 227, and a DSP module 228.

The DVD control module 221 controls components of the DVDA 220 and communicates with an external device (not shown) via an I/O interface 229. The external device may include a computer, a multimedia device, a mobile computing device, etc. The I/O interface 229 may include wireline and/or wireless communication links.

The DVD control module 221 may receive data from the buffer 222, nonvolatile memory 223, the processor 224, the spindle/FM driver module 225, the analog front-end module 226, the write strategy module 227, the DSP module 228, and/or the I/O interface 229. The processor 224 may process the data, including encoding, decoding, filtering, and/or formatting. The DSP module 228 performs signal processing, such as video and/or audio coding/decoding. The processed data may be output to the buffer 222, nonvolatile memory 223, the processor 224, the spindle/FM driver module 225, the analog front-end module 226, the write strategy module 227, the DSP module 228, and/or the I/O interface 229.

The DVD control module 221 may use the buffer 222 and/or nonvolatile memory 223 to store data related to the control and operation of the DVD drive 218. The buffer 222 may include DRAM, SDRAM, etc. Nonvolatile memory 223 may include any suitable type of semiconductor or solid-state memory, such as flash memory (including NAND and NOR flash memory), phase-change memory, magnetic RAM, and multi-state memory, in which each memory cell has more than two states. The DVD PCB 219 includes a power supply 230 that provides power to the components of the DVD drive 218.

The DVDA 220 may include a preamplifier device 231, a laser driver 232, and an optical device 233, which may be an optical read/write (ORW) device or an optical read-only (OR) device. A spindle motor 234 rotates an optical storage medium 235, and a feed motor 236 actuates the optical device 233 relative to the optical storage medium 235.

When reading data from the optical storage medium 235, the laser driver provides a read power to the optical device 233. The optical device 233 detects data from the optical storage medium 235, and transmits the data to the preamplifier device 231. The analog front-end module 226 receives data from the preamplifier device 231 and performs such functions as filtering and A/D conversion. To write to the optical storage medium 235, the write strategy module 227 transmits power level and timing data to the laser driver 232. The laser driver 232 controls the optical device 233 to write data to the optical storage medium 235.

Figure 5D:
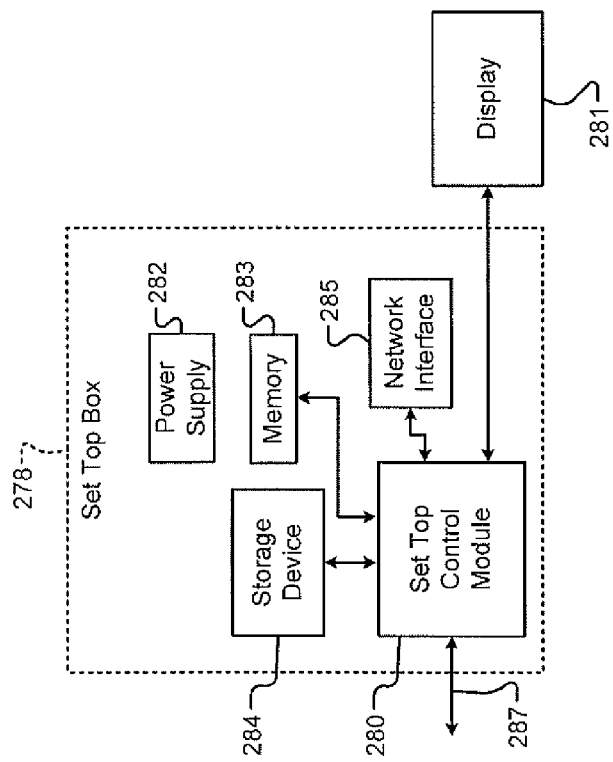
FIG. 5D is a functional block diagram of a set top box.
Figure 5C:
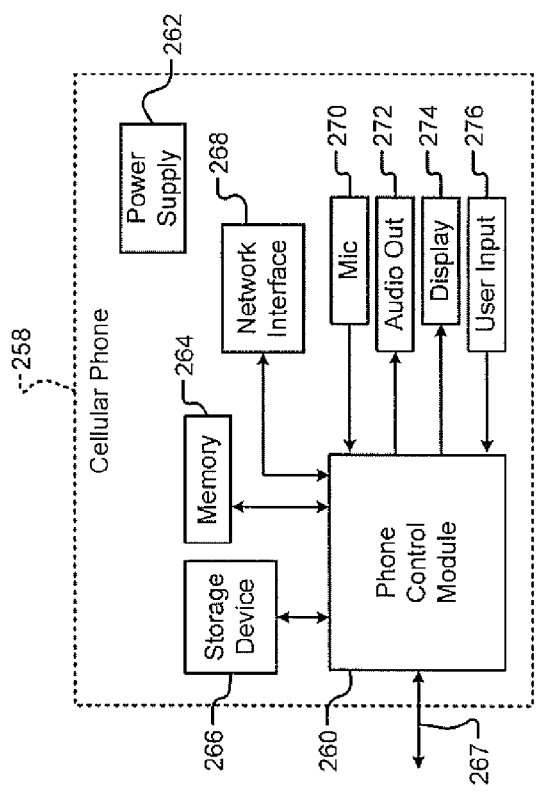
FIG. 5C is a functional block diagram of a cellular phone.

In FIG. 5C, the teachings of the disclosure can be implemented in nonvolatile portion of memory 264 and associated control circuitry of a cellular phone 258. The cellular phone 258 includes a phone control module 260, a power supply 262, memory 264, a storage device 266, and a cellular network interface 267. The cellular phone 258 may include a network interface 268, a microphone 270, an audio output 272 such as a speaker and/or output jack, a display 274, and a user input device 276 such as a keypad and/or pointing device. If the network interface 268 includes a wireless local area network interface, an antenna (not shown) may be included.

The phone control module 260 may receive input signals from the cellular network interface 267, the network interface 268, the microphone 270, and/or the user input device 276. The phone control module 260 may process signals, including encoding, decoding, filtering, and/or formatting, and generate output signals. The output signals may be communicated to one or more of memory 264, the storage device 266, the cellular network interface 267, the network interface 268, and the audio output 272.

Memory 264 may include random access memory (RAM) and/or nonvolatile memory. Nonvolatile memory may include any suitable type of semiconductor or solid-state memory, such as flash memory (including NAND and NOR flash memory), phase-change memory, magnetic RAM, and multi-state memory, in which each memory cell has more than two states. The storage device 266 may include an optical storage drive, such as a DVD drive, and/or a hard disk drive (HDD). The power supply 262 provides power to the components of the cellular phone 258.

In FIG. 5D, the teachings of the disclosure can be implemented in nonvolatile portion of memory 283 and associated control circuitry of a set top box 278. The set top box 278 includes a set top control module 280, a display 281, a power supply 282, memory 283, a storage device 284, and a network interface 285. If the network interface 285 includes a wireless local area network interface, an antenna (not shown) may be included.

The set top control module 280 may receive input signals from the network interface 285 and an external interface 287, which can send and receive data via cable, broadband Internet, and/or satellite. The set top control module 280 may process signals, including encoding, decoding, filtering, and/or formatting, and generate output signals. The output signals may include audio and/or video signals in standard and/or high definition formats. The output signals may be communicated to the network interface 285 and/or to the display 281. The display 281 may include a television, a projector, and/or a monitor.

The power supply 282 provides power to the components of the set top box 278. Memory 283 may include random access memory (RAM) and/or nonvolatile memory. Nonvolatile memory may include any suitable type of semiconductor or solid-state memory, such as flash memory (including NAND and NOR flash memory), phase-change memory, magnetic RAM, and multi-state memory, in which each memory cell has more than two states. The storage device 284 may include an optical storage drive, such as a DVD drive, and/or a hard disk drive (HDD).

Figure 5E:
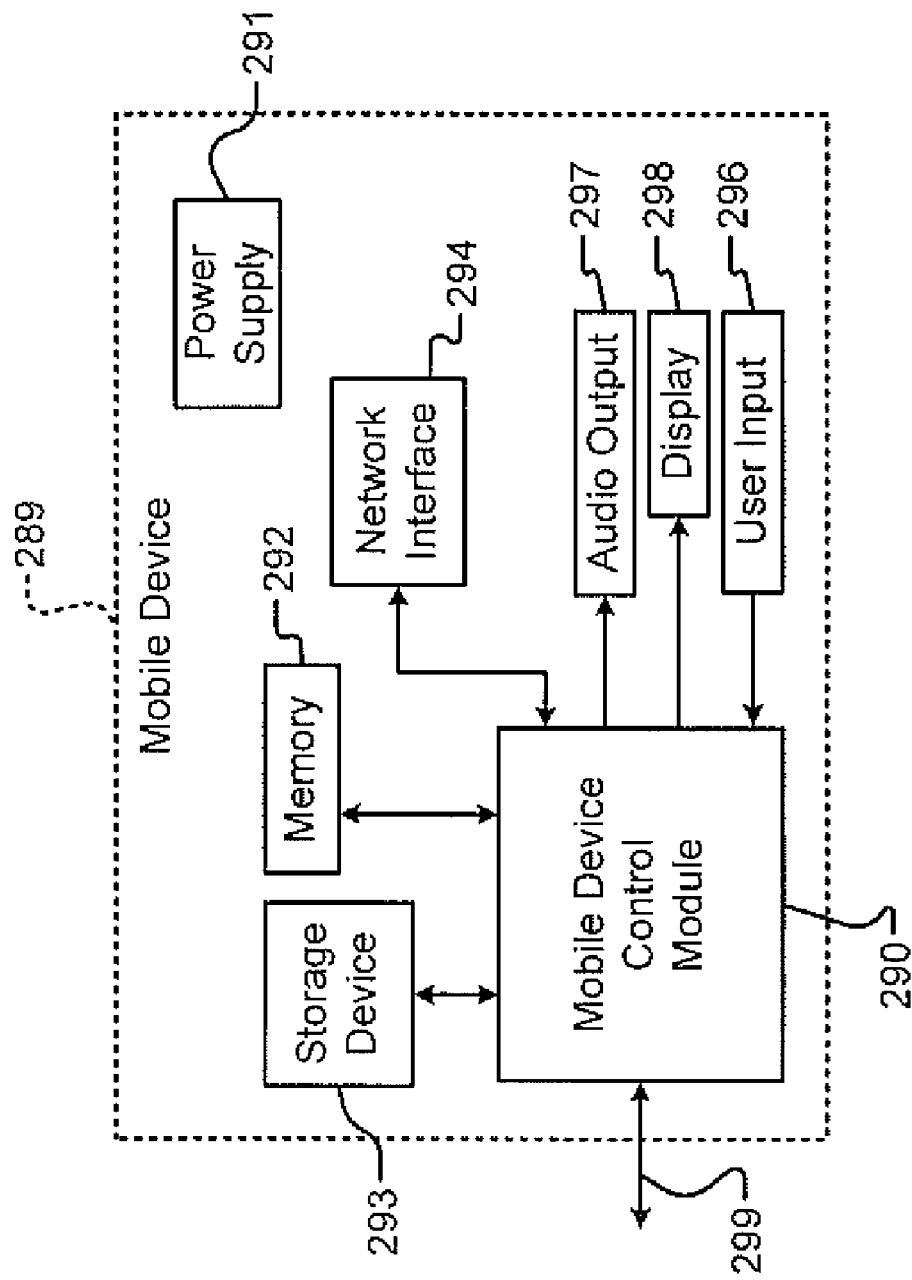
FIG. 5E is a functional block diagram of a mobile device.

In FIG. 5E, the teachings of the disclosure can be implemented in nonvolatile portion of memory 292 and associated control circuitry of a mobile device 289. The mobile device 289 may include a mobile device control module 290, a power supply 291, memory 292, a storage device 293, a network interface 294, and an external interface 299. If the network interface 294 includes a wireless local area network interface, an antenna (not shown) may be included.

The mobile device control module 290 may receive input signals from the network interface 294 and/or the external interface 299. The external interface 299 may include USB, infrared, and/or Ethernet. The input signals may include compressed audio and/or video, and may be compliant with the MP3 format. Additionally, the mobile device control module 290 may receive input from a user input 296 such as a keypad, touchpad, or individual buttons. The mobile device control module 290 may process input signals, including encoding, decoding, filtering, and/or formatting, and generate output signals.

The mobile device control module 290 may output audio signals to an audio output 297 and video signals to a display 298. The audio output 297 may include a speaker and/or an output jack. The display 298 may present a graphical user interface, which may include menus, icons, etc. The power supply 291 provides power to the components of the mobile device 289. Memory 292 may include random access memory (RAM) and/or nonvolatile memory.

Nonvolatile memory may include any suitable type of semiconductor or solid-state memory, such as flash memory (including NAND and NOR flash memory), phase-change memory, magnetic RAM, and multi-state memory, in which each memory cell has more than two states. The storage device 293 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system, comprising:
   a programming module configured to determine a programming value to which a state of a target cell is to be programmed, wherein the programming value is determined based on states of one or more cells near the target cell, and wherein the programming value is affected by the states of the one or more cells near the target cell; and
   an interference module configured to
      generate interference values based on (i) the state of the target cell and (ii) the states of the one or more cells near the target cell, and
      store the interference values,
      wherein the interference values correspond to effects of the states of the one or more cells near the target cell on the state of the target cell, and
   wherein the programming module is further configured to determine the programming value based on at least one of the interference values selected according to (i) the state of the target cell and (ii) the states of the one or more cells near the target cell.

2. The system of claim 1, wherein the programming module is configured to use the programming value to program the target cell to the state.

3. The system of claim 1, wherein the interference module is configured to generate the interference values based on interference experienced by the target cell due to (i) data previously written in the one or more cells or (ii) data to be written in the one or more cells.

4. The system of claim 1, wherein the programming module is configured to generate the programming value based on interference experienced by the target cell from the one or more cells, and wherein the interference is due to (i) data previously written in the one or more cells or (ii) data to be written in the one or more cells.

5. The system of claim 1, wherein the target cell communicates with a bit line, and wherein the one or more cells are located along the bit line.

6. The system of claim 1, wherein the target cell communicates with a word line, and wherein the one or more cells are located along the word line.

7. The system of claim 1, wherein the target cell and the one or more cells each includes a memory cell of nonvolatile memory.

8. The system of claim 7, wherein the nonvolatile memory includes (i) a flash memory or (ii) a phase-change memory.

9. The system of claim 1, wherein in response to each of (i) the target cell and (ii) the one or more cells including a memory cell of flash memory, the programming value indicates an amount of charge to program the target cell to the state.

10. A system, comprising:
    an interference module configured to
       generate an interference value based on (i) a first state of a first memory cell and (ii) a second state of a second memory cell, wherein the second memory cell is located near the first memory cell, and
       store the interference value; and
    a programming module configured to generate a programming value to program the first memory cell to the first state, wherein the programming value is based on the interference value.

11. The system of claim 10, wherein the programming module is configured to program the first memory cell to the first state using the programming value.

12. The system of claim 10, wherein the interference module is configured to generate the interference value prior to programming the first memory cell.

13. The system of claim 10, wherein the interference module is configured to generate the interference value (i) prior to programming the second memory cell or (ii) subsequent to programming the second memory cell.

14. The system of claim 10, wherein the second memory cell is located on (i) a bit line in communication with the first memory cell or (ii) a word line in communication with the first memory cell.

15. The system of claim 10, wherein each of (i) the first memory cell and (ii) the second memory cell includes a memory cell of a nonvolatile memory.

16. The system of claim 15, wherein the nonvolatile memory includes (i) a flash memory or (ii) a phase-change memory.

17. The system of claim 10, wherein in response to each of (i) the first memory cell and (ii) the second memory cell including a memory cell of a flash memory, the programming value indicates an amount of charge to program the first memory cell to the first state.

* * * * *